United States Patent
Iitani et al.

(10) Patent No.: US 7,235,868 B2
(45) Date of Patent: Jun. 26, 2007

(54) LEAD FRAME AND ITS MANUFACTURING METHOD

(75) Inventors: Ichi Iitani, Ohkuchi (JP); Youichirou Hamada, Ohkuchi (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

(21) Appl. No.: 10/482,962

(22) PCT Filed: Jul. 9, 2002

(86) PCT No.: PCT/JP02/06933

§ 371 (c)(1),
(2), (4) Date: Jan. 7, 2004

(87) PCT Pub. No.: WO03/007373

PCT Pub. Date: Jan. 23, 2003

(65) Prior Publication Data

US 2004/0169261 A1 Sep. 2, 2004

(30) Foreign Application Priority Data

Jul. 9, 2001 (JP) .............................. 2001-207316

(51) Int. Cl.
*H01L 23/495* (2006.01)
(52) U.S. Cl. .................................... 257/676
(58) Field of Classification Search ........ 257/666–676, 257/734, E23.04–E23.06
See application file for complete search history.

(56) References Cited

U.S. PATENT DOCUMENTS

| 4,770,899 | A | | 9/1988 | Zeller |
| 5,235,139 | A | | 8/1993 | Bengston et al. |
| 5,923,090 | A | * | 7/1999 | Fallon et al. ................ 257/777 |
| 6,025,640 | A | * | 2/2000 | Yagi et al. .................. 257/666 |
| 6,605,866 | B1 | * | 8/2003 | Crowley et al. ............. 257/692 |
| 6,876,067 | B2 | * | 4/2005 | Arai et al. .................. 257/666 |
| 6,953,986 | B2 | * | 10/2005 | Abbott et al. ............... 257/666 |
| 2002/0164893 | A1 | * | 11/2002 | Mathieu et al. ............... 439/66 |
| 2003/0146497 | A1 | * | 8/2003 | Abbott et al. ............... 257/666 |
| 2004/0036151 | A1 | * | 2/2004 | Hsiao et al. ................ 257/666 |
| 2004/0232528 | A1 | * | 11/2004 | Ito et al. .................... 257/666 |
| 2005/0196903 | A1 | * | 9/2005 | Miyaki et al. .............. 438/123 |
| 2006/0006523 | A1 | * | 1/2006 | Coyle et al. ................ 257/704 |

FOREIGN PATENT DOCUMENTS

| JP | 06-216298 | | 8/1994 |
| JP | 2000-58732 | | 2/2000 |
| JP | 2004343136 | A * | 12/2004 |

* cited by examiner

*Primary Examiner*—Nathan W. Ha
(74) *Attorney, Agent, or Firm*—Kenyon & Kenyon LLP

(57) ABSTRACT

A leadframe is plated with palladium only to a surface of a metal plate on which semiconductors elements are to be mounted and a surface of the metal plate to be placed on a substrate, and is not plated with palladium to lead portions, pad portions, other portions except for the surfaces to be plated and the side surface, of the leadframe, thereby, the amount of use of palladium is reduced to minimum and a cheap leadframe can be provided.

2 Claims, 5 Drawing Sheets

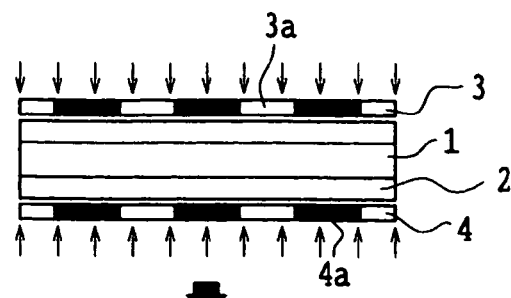
FIG. 3A
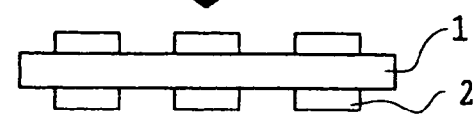
FIG. 3B
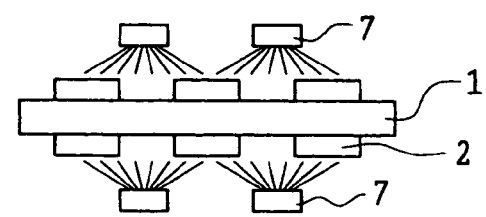
FIG. 3C
FIG. 3D
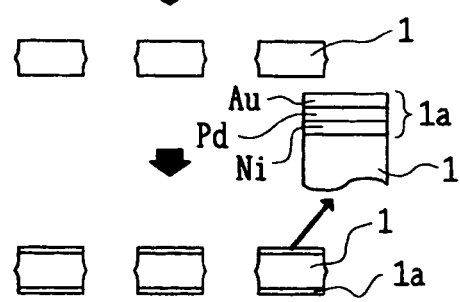
FIG. 3E
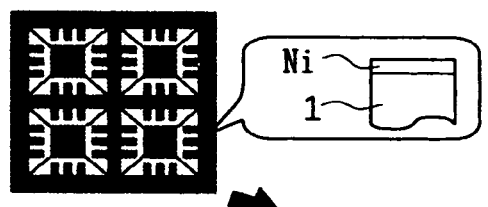
FIG. 3F
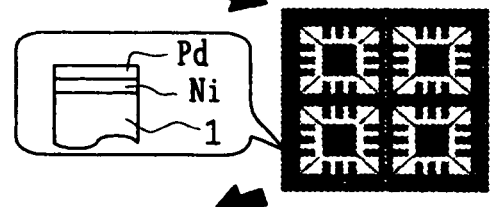
FIG. 3G
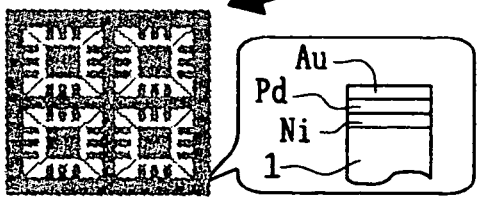
FIG. 3H

LEAD FRAME AND ITS MANUFACTURING METHOD

TECHNICAL FIELD

The present invention relates to a leadframe to be used for semiconductor devices and manufacturing method of the same.

BACKGROUND ART

Conventionally, a leadframe is manufactured in such way that a pattern of the leadframe is formed from a metal plate by etching or press processing, then, after palladium plating is carried out to the whole surface of it, semiconductor elements are mounted on the predetermined position, and then, after sealing with resin, cutting is carried out by using a die etc. Finally, separate chips are produced. Such products are in practical use as electronic parts as IC chips.

In recent years, in a specification of the leadframe, the use of coating by solder plating containing lead has ceased in consideration of the influence on environment, and palladium plating to the whole surface of the leadframe has been used. However, since palladium is an expensive metal material, there is a problem of raising the product cost by using palladium plating to the whole surface.

Accordingly, the main object of the present invention is to provide a cheaper leadframe by minimizing the amount of palladium used.

Other object of the present invention is to provide a manufacturing method of leadframe by which the fault of the leadframe is eliminated.

DISCLOSURE OF THE INVENTION

In order to attain the above-mentioned objects, the leadframe according to the present invention is characterized in that, in a leadframe which is formed from a metal plate, palladium plating is partially carried out only to necessary and minimum portions on which semiconductor elements are to be mounted, portions to bond gold wires and portions to be soldered of a surface to be placed on a printed circuit board.

Besides, the leadframe according to the present invention is characterized in that, in a leadframe which is formed from a metal plate, palladium plating is carried out only to a surface on which semiconductor elements are to be mounted and a surface to be placed on a printed circuit board, and that the palladium plating is not carried out to lead portions formed, pad portions, other portions except for the surfaces to be plated and its side surface.

Besides, the leadframe according to the present invention is characterized in that, in a leadframe which is formed from a metal plate, palladium plating is carried out only to necessary and minimum portions of a surface on which semiconductor elements are to be mounted and a surface to be placed on a printed circuit board, the palladium plating is not carried out to lead portions formed, pad portions, other portions except for the portions of the surfaces to be plated and its side surface.

According to the present invention, much cheaper leadframes can be provided since the area to be plated with palladium can be minimized, in comparison with the conventional leadframe in which palladium plating is carried out to the whole area.

Further, in the manufacturing method of a leadframe according to the present invention, a leadframe material is provided by forming a metal plate, and then, palladium plating is carried out only to portions which are necessary and minimum for mounting of semiconductor elements of the leadframe material, and then, the plating is carried out to portions to bond gold wires and necessary and minimum portions to be soldered of a surface to be placed on a printed circuit board, of the leadframe material.

Besides, in the manufacturing method of a leadframe according to the present invention, a leadframe material is provided by forming a metal plate, and then, palladium plating is carried out only to a surface of the leadframe material on which semiconductor elements are to be mounted and then, the plating is carried out only to a surface of the leadframe material to be placed on a printed circuit board, while the plating is not carried out to lead portions, pad portions, other portions except for the surfaces to be plated and the side surface of the leadframe material.

Besides, in the manufacturing method of a leadframe according to the present invention, a metal plate is prepared to form a leadframe, and then, a resist layer is formed on the both sides of the metal plate. And after having made a mask (e.g. a mask, which is closely attached to the surface of the resist layer, for exposing light, developing and plating) with a desired pattern of the leadframe on the surface of the resist layer, the surface of the exposed metal plate is plated, wherein the plated layers containing at least palladium plated layer are formed and then the mask is stripped, and a resist layer is again formed on the whole both sides of the plate. Then, after exposing light by using the mask with a predetermined pattern and developing are carried out, an etching mask is obtained. And then, the shape of lead portions, pad portions and other portions are formed by etching.

Further, in the manufacturing method of a leadframe according to the present invention, a metal plate is provided to form a leadframe by forming the metal plate and then a resist layer is formed on the both front and back surfaces of the metal plate. And after having made a mask (e.g. a mask, which is closely attached to the surfaces of the resist layer for exposing light, developing and plating) with a desired pattern of the leadframe on the surface of the resist layer, the surface of the exposed metal plate is plated, wherein plated layers containing at least palladium plated layer is formed. Then, the resist layer is removed, etching of the metal plate is carried out by using the plated layer as an etching resist, wherein the etching is stopped before the portions of the metal plate which is necessary to be etched are penetrated by the etching. And then, the back surface of the metal plate is masked with a tape, and the portion of the metal plate, which is necessary to be etched, is penetrated by carrying out etching again. Thus, the relation of positions of a number of lead portions etc. can be kept individually and independently by the tape.

Further, in the manufacturing method of a leadframe according to the present invention, a metal plate is provided to form a leadframe and then a resist layer is formed on the both sides of the metal plate. And after having made a mask (e.g. a mask for carrying out etching which is closely attached to the surface of the resist layer for exposing light, and then developing) with a desired pattern of the leadframe on the surface of the resist layer, the exposed metal plate portion is removed by the etching and the pattern of leadframe is formed. Then, the both front and back surfaces of the leadframe are plated so as to form a plated layer containing at least palladium layer.

Further, in the manufacturing method of a leadframe according to the present invention, a metal plate is provided to form a leadframe and a resist layer is formed on the both front and back surfaces of the metal plate. And after making a mask (e.g. a mask for carrying out plating which is closely attached to the surface of the resist layer and to which light is exposed and then developing is carried out) with a desired pattern of the leadframe on the surface of the resist layer, the surface of the exposed metal plate is plated, thereby, plated layers containing at least palladium plated layer are formed. Then the resist layer is removed and etching of the metal plate is carried out by using the plated layer as an etching resist. Thus, patterns of a number of lead portions, pad portions and others are formed.

According to the methods described above, the leadframe which is not only cheaper but also does not cause such fault as missing of lead, breakage of resin etc., as seen in the conventional leadframe can be provided since it is good enough to cut only the resin portion at the time when the leadframe is cut into small chips by using the cutting or dicing device etc., after semiconductor elements are mounted on the predetermined position on the leadframe and sealing is made by resin because the metal portions to be cut has already dissolved by the etching.

These and other objects as well as the features and advantages of the present invention will become apparent from the following the detailed description referred to the accompanying drawings.

BRIEF EXPLANATION OF DRAWINGS

FIG. 3A–3H is a flowchart illustrating the other embodiment of manufacturing a lead frame according to the present invention.

FIG. 4A–4H is a flow chart illustrating further other embodiment of manufacturing a lead frame according to the present invention.

BEST MODE FOR CARRYING OUT THE INVENTION

Embodiment 1

FIG. 1 is a flowchart illustrating an embodiment of the manufacturing method of leadframe according to the present invention. In the FIG. 1, 1 is a plate of copper or similar material for forming a leadframe. 2 is a dry film mounted on the front and back surface of the metal plate 1. 3 is a glass mask which is put on the dry film 2 placed on the surface of the metal plate 1, and which forms a leadframe pattern 3a by using a light shielding agent. 4 is a glass mask which is put on the dry film 2 placed on the back surface of the metal plate 1, and which forms a leadframe pattern 4a on symmetrically opposite side to the leadframe pattern 3a with respect to the metal plate 1 by using the light shielding agent. 5 and 6 are glass masks which form predetermined shading patterns, and 7 are a plurality of etching liquid injection nozzles which are disposed oppositely at both sides of the metal plate 1.

Figure 1A:
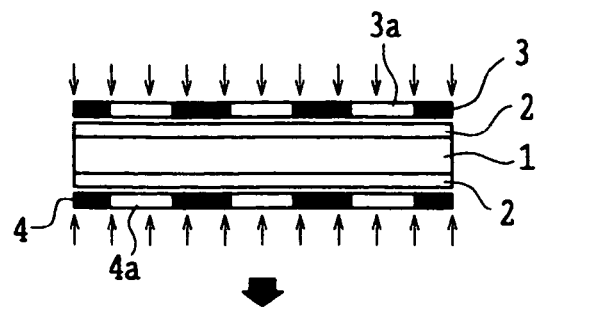
FIG. 1A–1H is a flowchart illustrating an embodiment of manufacturing a lead frame according to the present invention.

Next, the manufacturing process of the leadframe will be explained in turn. First, as shown in FIG. 1A, the dry film 2 working as photoresist is placed on the whole front and back surfaces of the metal plate 1. Then, the glass masks 3 and 4 which have the leadframe patterns 3a and 4a are put on the front and back surfaces at the state of positioning of the pattern. And such both surfaces are exposed by the ultra violet ray through the glass masks 3 and 4.

Figure 1B:
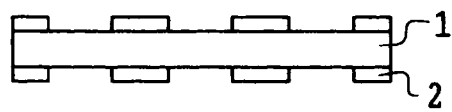

After exposure, the glass masks 3 and 4 are removed and the metal plate 1 with dry film is soaked into the developing solution for development. Thus only the portions of the dry film 2 exposed by the ultra violet ray, i.e., portions which are necessary to be plated with palladium, such as portions to which gold wires are bonded and portions for mounting thereon semiconductor elements are removed as shown in FIG. 1B.

Figure 1C:
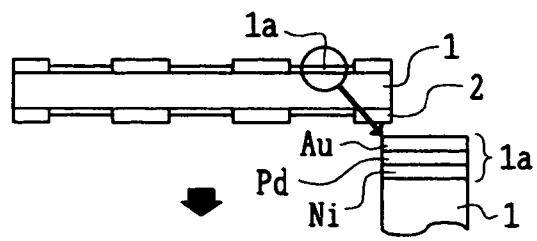
Figure 1D:

Next, this is put into a plating tub, and as shown by partially enlarged scale in FIG. 1C, necessary plating of nickel (Ni), palladium (Pd) and gold (Au) etc. is carried out in turn for necessary portions. In this way, the metal plate 1 with the plated layer 1a of the cross-sectional configuration as shown in FIG. 1D can be obtained by stripping the dry film 2.

Figure 1E:
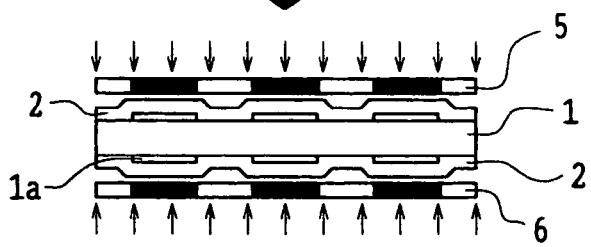
Figure 1F:
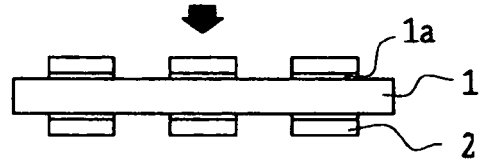

The dry film 2 is again placed on the whole both front and back surfaces of the metal plate 1 with the plated layer 1a which was obtained in the way as described above. Then, as shown in FIG. 1E, the glass masks 5 and 6 on which the pattern is formed so as to shade only the plated portions are put on the film 2 and the both sides are again exposed by the ultra violet ray. Then, as explained in FIG. 1B, the development is carried out, and the metal plate 1 with the plated layer 1a of the cross-sectional configuration as shown in FIG. 1F is obtained.

Figure 1G:
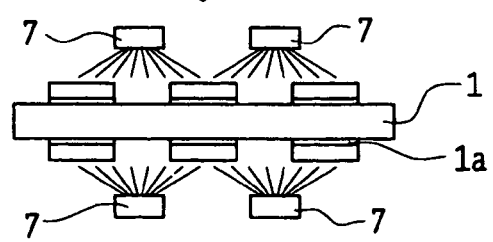
Figure 1H:
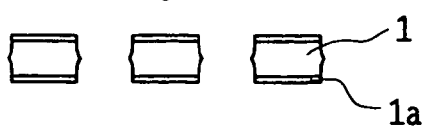

As shown in FIG. 1G, etching is carried out by spraying etching liquid through the injection nozzles 7 on the both surfaces of the metal plate 1 with plated layer 1a. By this etching, the metal portions on which plating is not carried out is dissolved and removed. Finally, by stripping the dry film 2, one frame of the leadframe which has the cross-sectional configuration as shown in FIG. 1H, that is, on which plating was carried out only to the necessary minimum portion is obtained.

Each process shown in FIGS. 1A to 1H is carried out continuously by conveying a metal plate having the length including a plurality of frames on an appropriate conveyer and each frame of the leadframe is completed after being cut at the final stage of the process. As it is evident by the explanation above, consequently, palladium plating is carried out only to necessary portions of the front and back surfaces of each leadframe.

Embodiment 2

FIG. 2 shows a flowchart illustrating another embodiment of the manufacturing method of leadframe according to the present invention. In FIG. 2, the same reference numerals in FIG. 1 are used to the substantially same components and portions, the explanation of the reference numerals are omitted. Since each process shown in FIGS. 2A, 2B, 2C and 2D is the same as each process shown in FIGS. 1A, 1B, 1C and 1D as it is clearly seen by comparison with FIG. 1, the explanation of such process is omitted, with respect to each process shown after FIG. 2E, the explanation will be made.

Figure 2A:
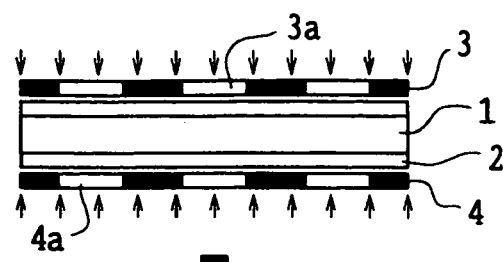
FIG. 2A–2H is a flowchart illustrating another embodiment of manufacturing a lead frame according to the present invention.
Figure 2B:
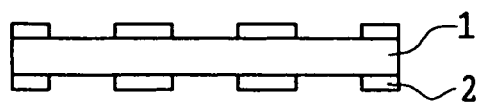
Figure 2C:
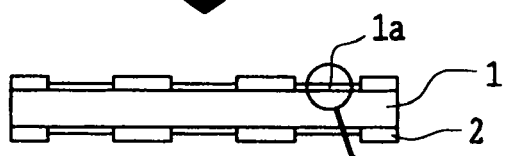
Figure 2D:
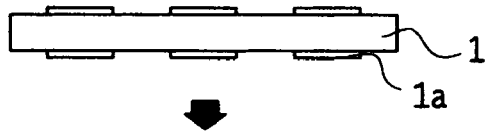
Figure 2E:
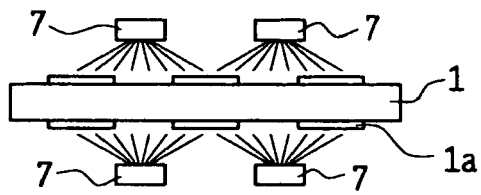

As shown in FIG. 2E, the etching is carried out by spraying the etching liquid through the injection nozzles 7 to the both sides of the metal plate 1 with the plated layer 1a. Such etching is carried out until the metal of the portion where the plating is not carried out becomes extremely thin in consequence of such metal having been almost dissolved and removed.

Figure 2F:
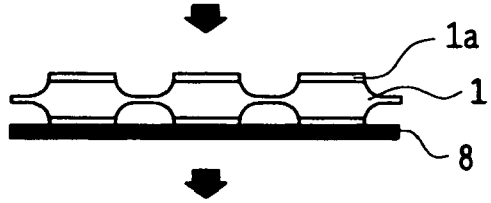
Figure 2G:
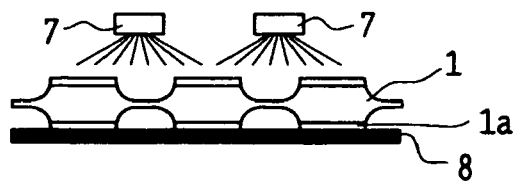
Figure 2H:
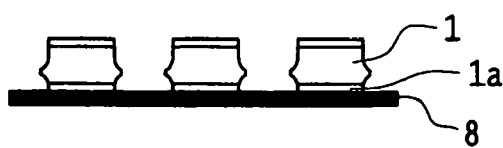

After a tape 8 is attached, as shown in FIG. 2F, to the whole surface of the one side of the metal plate 1 with the plated layer 1a which was obtained in this way, the etching is again carried out by spraying the etching liquid through the injection nozzles 7 from the side to which the tape 8 is not attached as shown in FIG. 2G. Thus, the extremely thin metal portions to which the plating is not carried out (unnecessary portions, such as tie bars for connecting lead portions and hanging leads which are to be cut out after the assembling process) are completely dissolved and removed. In this case, the remained metal portions namely, such necessary portions as portions on which semiconductor elements are to be mounted, pad portions and lead portions where the plating has been carried out are certainly held without collapsing relative positions by the tape 8, as shown in FIG. 2H.

Embodiment 3

FIG. 3 shows a flowchart illustrating still another embodiment of the manufacturing method of leadframe according to the present invention. In FIG. 3, the same reference numerals in FIG. 1 are used to the substantially same components and portions, the explanation of those numeral references is omitted. Since each process shown in FIGS. 3A and 3B is the same as the process shown in FIGS. 1A and 1B as it is clearly seen in comparison with FIG. 1, the explanation of such processes is omitted, with respect to each process shown after FIG. 3C, the explanation will be made.

As shown in FIG. 3C, the etching is carried out by spraying the etching liquid through the injection nozzles 7 on both sides of the metal plate 1 on which the dry film 2 remains corresponding to the leadframe pattern. Such etching is carried out until the metal plate 1 comes to have penetrated holes as a consequence of dissolution and removal of the metal of portions on which the dry film 2 do not exist, as shown in FIG. 3D. Thus the dry film 2 is stripped from the both surfaces of the metal plate 1 having the holes. In this way, the leadframe material with cross sectional configuration as shown in FIG. 3D is manufactured.

On the necessary portions on the front and back surfaces of the leadframe material (metal plate 1) obtained in this way, the nickel (Ni) plating, palladium (Pd) plating, and gold (Au) plating are carried out, respectively, as shown by an enlarged scale in FIG. 3E and then a leadframe is completed. That is to say, as shown in FIG. 3F, at first, the nickel (Ni) plating is carried out to the whole surface of the front and back surfaces of the leadframe as a ground layer, and then as shown in FIG. 3G below, the palladium (Pd) plating is carried out only to the necessary minimum portions for semiconductor mounting portions, portions to bond gold wires and portions to be soldered of the surface to be on a printed circuit board. Finally, as shown in FIG. 3H, the gold (Au) plating is carried out to the both sides of the front and the back surfaces of the leadframe and then a leadframe is completed. Thus, according to the present invention, the amount of the expensive palladium used can be at a minimum, and the finished product of a leadframe is much cheaper as compared with the conventional leadframe.

Embodiment 4

FIG. 4 shows a flowchart of still another embodiment of the manufacturing method of leadframe according to the present invention. The same reference numerals used in FIG. 1 are given to the substantially same components and portions and the explanation about them is omitted. The explanation of FIGS. 4A to 4D is omitted since each process is the same as those of FIGS. 1A to 1D as it is evident by comparison with FIGS. 1A to 1D. The processes shown after FIG. 4E will be explained.

Figure 4A:
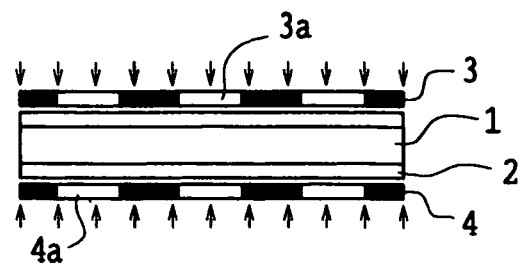
Figure 4B:
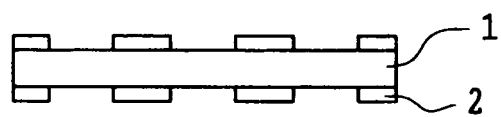
Figure 4C:
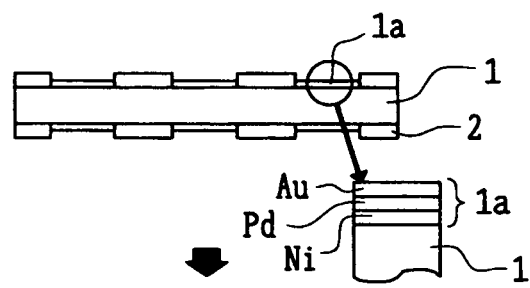
Figure 4D:
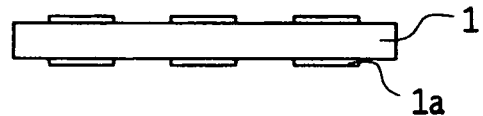
Figure 4E:
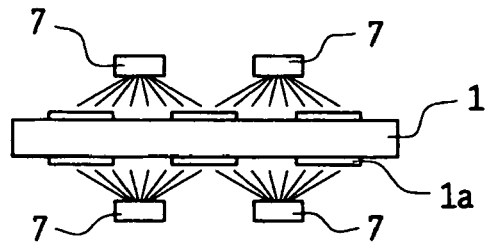
Figure 4F:
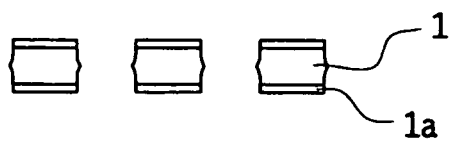
Figure 5:
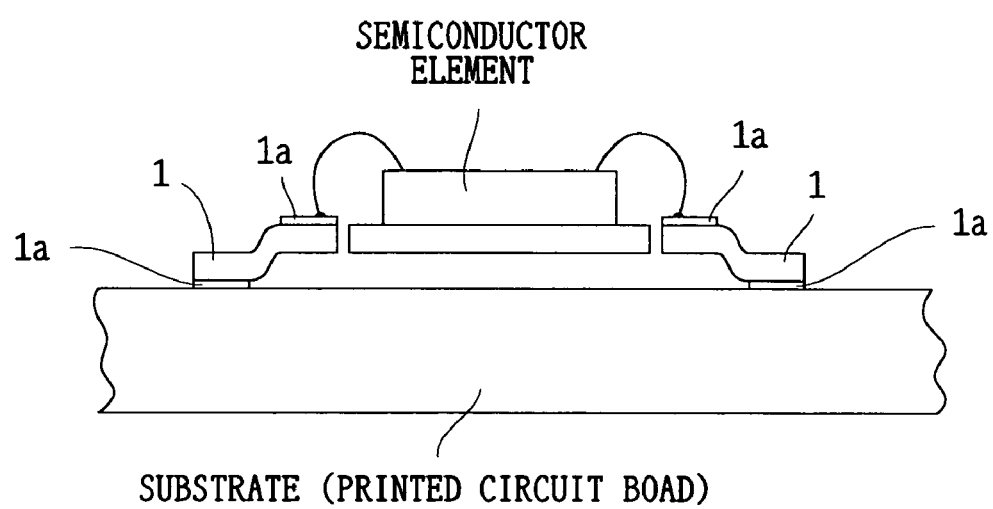
FIG. 5 is a schematic side view illustrating the positional relation between a lead frame manufactured by the method of the present invention and a substrate as a printed circuit board.

This embodiment differs from the first embodiment in such point that the product is manufactured by the etching, that is, by spraying the etching liquid through the injection nozzles 7 on both sides of the metal plate obtained in FIG. 4D on which the plating was completed without carrying out the second light exposure and the development. According to this embodiment, the product can be provided much cheaper.

As explained above, according to the present invention, the leadframe which is not only much cheaper but also does not cause fault such as missing of lead and breakage of resin in comparison with the product by the conventional method can be provided.

The invention claimed is:

1. A leadframe formed from a metal plate, comprising:
   a first surface for mounting thereon a semiconductor element,
   a second surface to be placed on a printed circuit board, and
   shaped lead portions,
   wherein nickel, palladium and gold are plated in turn only to said first and second surfaces, while said shaped lead portions, non-mounted portions including pad portions, and said faces of said leadframe are free from plating.

2. A leadframe formed from a metal plate, comprising:
   a first surface for mounting thereon a semiconductor element,
   a second surface to be placed on a printed circuit board, and
   shaped lead portions,
   wherein nickel, palladium only and gold are plated in turn only to a necessary and minimum part of said first and second portions, while said shape lead portions, non-mounted portions including pad portions, and side faces of said leadframe are free from plating.

* * * * *

UNITED STATES PATENT AND TRADEMARK OFFICE
CERTIFICATE OF CORRECTION

PATENT NO. : 7,235,868 B2  Page 1 of 1
APPLICATION NO. : 10/482962
DATED : June 26, 2007
INVENTOR(S) : Ichinori Iitani et al.

It is certified that error appears in the above-identified patent and that said Letters Patent is hereby corrected as shown below:

On the title page Item [75]: Change the name of the first-named inventor to

--Ichinori Iitani--.

| Column | Line | |
|---|---|---|
| 6 | 36 | Claim 1 change "placed" to --mounted--. |
| 6 | 42 | Claim 1 change "said faces" to --side faces--. |
| 6 | 46 | Claim 2 change "placed" to --mounted.--. |
| 6 | 49 | Claim 2 after "palladium" delete "only". |
| 6 | 51 | Claim 2 change "shape lead" to --shaped lead--. |

Signed and Sealed this

Twenty-fifth Day of March, 2008

JON W. DUDAS
*Director of the United States Patent and Trademark Office*